(12) United States Patent
Heuermann

(10) Patent No.: US 7,755,217 B2
(45) Date of Patent: Jul. 13, 2010

(54) PULSE GENERATOR

(75) Inventor: Oliver Heuermann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 257 days.

(21) Appl. No.: 12/002,092

(22) Filed: Dec. 13, 2007

(65) Prior Publication Data

US 2008/0150370 A1      Jun. 26, 2008

(30) Foreign Application Priority Data

Dec. 20, 2006    (DE) .................... 10 2006 060 417

(51) Int. Cl.
*H02M 3/18*    (2006.01)
(52) U.S. Cl. .................................... 307/110
(58) Field of Classification Search .............. None
See application file for complete search history.

(56) References Cited

U.S. PATENT DOCUMENTS

| | | | |
|---|---|---|---|
| 3,111,594 A | | 11/1963 | Stolte |
| 3,366,799 A | * | 1/1968 | Fitch ........................... 307/110 |
| 3,746,881 A | * | 7/1973 | Fitch et al. ................... 307/110 |
| 3,845,322 A | * | 10/1974 | Aslin ........................... 307/108 |
| 4,900,947 A | * | 2/1990 | Weiner et al. ................ 307/110 |
| 5,153,460 A | * | 10/1992 | Bovino et al. ................ 307/108 |
| 5,311,067 A | * | 5/1994 | Grothaus et al. ............. 307/108 |
| 7,170,198 B2 | | 1/2007 | Sack |
| 7,209,373 B2 | * | 4/2007 | Oicles et al. .................. 363/59 |
| 7,301,250 B2 | * | 11/2007 | Cassel ......................... 307/106 |
| 7,554,221 B2 | * | 6/2009 | Cassel ......................... 307/108 |
| 2002/0105773 A1 | * | 8/2002 | Seely et al. .................. 361/263 |
| 2007/0159760 A1 | * | 7/2007 | Clark ........................... 361/118 |
| 2008/0036301 A1 | * | 2/2008 | McDonald ................... 307/108 |
| 2008/0191559 A1 | * | 8/2008 | Staines ......................... 307/108 |
| 2008/0284276 A1 | * | 11/2008 | McDonald ................... 310/308 |

FOREIGN PATENT DOCUMENTS

| | | |
|---|---|---|
| DE | 103 20 425 A1 | 12/2004 |
| DE | 103 56 648 A1 | 7/2005 |

OTHER PUBLICATIONS

German Office Action dated Aug. 24, 2007 for De 10 2006 060 417.2-32 with English translation.

* cited by examiner

*Primary Examiner*—Stephen W Jackson
*Assistant Examiner*—Adi Amrany
(74) *Attorney, Agent, or Firm*—Brinks, Hofer, Gilson & Lione

(57) ABSTRACT

A method for controlling a pulse generator is provided. The method includes measuring a switch-on time difference for each cell and controlling the semiconductor switches of each cell for the voltage pulse as a function of the switch-on time difference. The switch-on time difference is measured between a switch-on signal for switching the respective semiconductor switch of the cell to a conducting state and a system response dependent on the switching to the conducting state. A second switch-on signal for each cell is generated in such a time-shifted manner that the system response of each cell occurs simultaneously. The system response is dependent on the switching to the conducting state.

12 Claims, 4 Drawing Sheets

PULSE GENERATOR

This patent document claims the benefit of DE 10 2006 060 417.2 filed Dec. 20, 2006, which is hereby incorporated by reference.

BACKGROUND

The present embodiments relate to generating a voltage pulse with a pulse generator.

Marx generators generate transient pulse voltages of short duration and high amplitude.

Marx generators charge a large number of capacitors in parallel with direct voltage to the value of a stage voltage and then connect the capacitors suddenly in series. As the parallel-connected capacitors are being charged, the charging currents are added, and when subsequently series-connected, the voltages are added, as required, via the capacitors.

A charging voltage is provided, for example, via a transformer and an appropriately rated rectifier. The charge voltage charges a pulse capacitance via a charging resistor and/or a charging coil. The charging process generally occurs relatively slowly over a period in the range of several seconds. The voltage at the pulse capacitor follows an e-function and reaches its quasi-stationary final value after approximately 5τ. A spark gap is adjusted such that at the quasi-stationary final voltage value, the spark gap fails to break down. The spark gap can be brought to flashover after an arbitrarily selectable time period by suitable ignition devices. At this moment, the spark gap constitutes a closed switch. The temporal course of the pulse voltage emitted is determined via the component values of the generator and via the electrical values of the load.

With a single-stage pulse circuit, which may be called a cell, no higher voltage than the charging voltage can be achieved at the load. For the pulse voltages needed, a multi-stage arrangement of several cells in a Marx circuit is used in high-voltage installations.

DE 103 20 425 A1 discloses a Marx generator. The Marx generator has a number n of pulse capacitors. The pulse capacitors may be called stage capacitors. DE 103 20 425 A1 discloses a trigger/ignition device in the Marx generator including n stage capacitors (n is natural and greater than 1), an equal number of switches/spark gaps, and 2(n−1) charging branches. The spark gaps of the Marx generator operate in self-breakdown mode. The trigger/ignition device includes at least one pulse transformer connected to a pulse generator. In at least one of the charging branches of the Marx generator, an overvoltage, which is sufficient for self-breakdown, is generated in a time-determined manner for a short period at the adjacent spark gap. The charging branch with the associated stage capacitor bridges the spark gap, except at the output end. The output winding of the pulse transformer acts during the charging as a charging coil/inductivity. The input winding is connected to the pulse generator. The voltage pulse, which is generated with the pulse transformer upon ignition/triggering of the pulse generator, is added to the charge voltage of the associated stage capacitor and generates for a short period the overvoltage necessary for self-breakdown of the adjacent spark gap.

All n stage capacitors of the cells are charged simultaneously via the charging direct voltage. Coils can limit the charge current. The sparking distances of the spark gaps are chosen such that the paths fail to break down when the maximum charge voltage is reached. When all the pulse capacitors have been charged to their quasi-stationary final voltage value, ignition at the first spark gap takes place. At the next spark gap, a voltage that is now twice as high, namely twice the charge voltage, is applied so that this will also ignite. Within an extremely short time, all the spark gaps ignite in this manner, such that n times the stage voltage declines at the load.

SUMMARY AND DESCRIPTION

The present embodiments may obviate one or more of the drawbacks or limitations of the related art. For example, one embodiment relates to a method for triggering a pulse generator.

In one embodiment, a method for controlling a pulse generator with multiple cells is provided. The pulse generator may be a Marx generator or other pulse generator with differently connected cells. The pulse generator generates a pulse having a power greater than one megawatt.

Each cell includes a controllable semiconductor switch and a capacitor for generating a voltage pulse through series connection and/or parallel connection of the capacitors by the semiconductor switches. In a Marx generator the capacitors may be stage capacitors. For example, the semiconductor switches may be IGBTs, DMOS-FETs, GTOs, thyristors or other similar switches. The semiconductor switches may be switched off. Each cell may include one or more semiconductor switches.

The capacitors may be connected in series, parallel, or a combination thereof. In the case of a series connection, the capacitor voltages may be added. In the case of a parallel connection, the discharge currents may be added. For the parallel connection, for example, all the discharge currents may flow out of the capacitors into a current node. The discharge currents may be added by adding the magnetic flow density generated by the discharge currents in a pulse transformer.

In one embodiment, the method can, for example, be embodied as software in a wired program routine (ROM) or in a programmable memory (EEPROM).

The method may include measurement of one switch-on time difference for each cell respectively. A time meter, which may be a timer, can measure time. Real time meters have a temporal resolution. The switch-on time difference for each cell is measured between a switch-on signal and a system response. The switch-on signal forms the start point of the time measurement and the arrival of the system response forms the end point of the time measurement. The 'system response' may be a pulse response, weight function, or step response. The system response is the output signal of a one-dimensional time-invariant system. A pulse or step is fed, as a switch-on signal, to the input of the one-dimensional time-invariant system.

The switch-on signal switches the respective semiconductor switch of the corresponding cell to the conducting state. The switch-on signal is, for example, a rising edge. Alternatively, a falling edge could also be used as a switch-on signal.

The system response is dependent on the switching to the conducting state. The conducting semiconductor switch connects the charge voltage of the capacitor to the output. At the output, for example, a significant course of the output voltage can be evaluated as a system response.

The semiconductor switches of the cells for the voltage pulse may be controlled. The controlling of the semiconductor switches may be a function of the switch-on time differences. The switch-on signal is generated for the respective cell in such a time-shifted manner that the system response of each cell occurs simultaneously.

Simultaneous is understood here to be a match that is achievable within the framework, for example, of a temporal resolution of the measurement and a temporal resolution of the control.

In one embodiment, a switch-off time difference may be measured. For example, measurement of one switch-off time difference for each cell, respectively, is provided. The switch-off time difference is measured between a switch-off signal for switching the respective semiconductor switch of the cell to the blocking state and a system response dependent on the switching to the blocking state. The switch-off signal is, for example, a falling edge. Alternatively, a pulse on a reset line may be used. The switch-off time difference of a cell may be different from the switch-on time difference. If a voltage pulse with a defined length is generated, the switch-off time differences or a variable derived from the switch-off time differences may be stored.

In one embodiment, the semiconductor switches are controlled. For example, the controlling of the semiconductor switches of the cells for the voltage pulse is a function of the switch-off time differences. The switch-off signal of the respective cell is generated in such a time-shifted manner that the system response of each cell occurs simultaneously. The system response may be dependent on the switching to the blocking state.

In one embodiment, the modules including respectively multiple series-connected cells are triggered for generating the voltage pulse. The modules may be coupled such that the pulse power of the modules is added.

A module-switch-on time difference for each module may be measured. The module-switch-on time difference is measured between a switch-on time for generating a current pulse of the module and a system response dependent on the current pulse. The system response dependent on the current pulse is dependent on an impedance acting at the output of each module. Electrical characteristics of the cells of the module are a factor influencing the system response dependent on the current pulse. The system response dependent on the current pulse can, for example, be determined from the course of the measured output current of the module. The module-switch-on time difference may be measured, for example, by a time meter (timer). The time meter is started at the switch-on time and stopped when the system response dependent on the current pulse is received.

The switch-on time may be determined from the switch-on differences of the individual cells of the module. The switch-on time may be defined in a mean range between the longest runtime of a cell of the module and the shortest runtime of a cell.

The control of the modules for the voltage pulse is a function of the module-switch-on time differences. The switch-on time of the respective module is generated in such a time-shifted manner that the system response of each module occurs simultaneously. The system response is dependent on the current pulse.

In one embodiment, the switch-on time differences and/or the switch-off time differences and/or module-switch-on time differences and/or the switch-on times and/or variables dependent hereon are stored in a table in a non-volatile memory. A non-volatile memory is, for example, an EEPROM. Changes in the values may be stored, so that, for example, a history can be read out from the memory for diagnostic purposes.

Electrical characteristics of the cells can change over the lifetime and via influences such as, for example, temperature fluctuations. The measuring may be carried out cyclically or in a predetermined order, such as during a system warm-up sequence.

In one embodiment, a change of electrical characteristics of a component is determined from the measurement of the system response. A component is any possible structural element, for example, of one of the cells or of the overall system of the pulse generator. Diagnostic information may be output as a function of this change. The diagnostic information enables maintenance of the system and reduces possible downtimes.

In one embodiment, a system generates a voltage pulse with a Marx generator.

The system generates a voltage pulse with a pulse generator. The system includes multiple cells in series connection and/or parallel connection. Each cell has a capacitor and a semiconductor switch. A driver may be integrated for controlling the semiconductor switches.

A control circuit is connected to each cell for controlling the semiconductor switch. The connection may be direct or indirect, for example, via drivers and/or a transmission path.

The control circuit may execute the functions stated below. The control circuit includes, for example, a programmable microcontroller for executing functions. The programmable microcontroller may include integrated subcircuits for executing the functions stated below.

The control circuit may generate a switch-on signal for switching each individual semiconductor switch to a conducting state. For example, switchable power components, such as IGBTs, DMOS-FETs or similar devices, can be used as semiconductor switches. In the conducting state, these have a low switch-on resistance so the stage capacitors are electrically connected via the switched-on semiconductor switch. Depending on the security requirements, the switch-on signal can include, for example, a simple edge or, for a secure transmission, of a binary code.

The control circuit may measure one system response for each individual cell, respectively. The system response is dependent on the switching of the semiconductor switch to the conducting state. For measuring, an analog-digital converter or a threshold switch may be connected to an output for measuring voltage.

The control circuit may measure a time difference between the generation of the switch-on signal and the system response for each cell, respectively. For the time measurement, a time meter (timer) may be started as a function of the switch-on signal and stopped as a function of the system response.

The control circuit may provide time-shifted control of the semiconductor switches of the cells for a series connection and/or for a parallel connection of the capacitors for the voltage pulse. The time-shifted control may be a function of the respective time difference, such that the system response of each cell is simultaneous.

In one embodiment, a plurality of modules may include multiple series-connected cells. The outputs of the modules are coupled for generating the voltage pulse. The coupling may be an electrical connection and/or a capacitive coupling and/or a magnetic coupling by a pulse transformer. As a result of the coupling, the pulse power of the modules may be added. The coupling may produce a series connection and/or a parallel connection of the modules.

In one embodiment, the control circuit may individually control each module. The control circuit may be connected to each module via an interface. For high-speed signal transmission, the interface is a parallel interface. Alternatively, for secure signal transmission, a serial interface or a data bus is used.

In one embodiment, the pulse generator may be a Marx generator. The cells may be connected in a Marx circuit. The capacitors of each Marx cell may be stage capacitors.

A previously explained method or a previously explained system for a magnetron or a klystron may be used, for example, for medical applications. For medical applications, a pulse should have a shape that approximates, as closely as possible, the ideal rectangle. Only the duration of the plateau of the rectangular signal may be used for medical applications. Rising courses, overshoots and falling courses of the voltage pulse may represent losses. Only during the plateau of the rectangular voltage pulse can an electron beam be generated in a stable manner, for example, for a klystron, and used for medical purposes. An adjustability of the temporal plateau width enables the selective generation of a high-frequency wave for the treatment of cancer. The wave characteristics may be adapted via the characteristics of the voltage pulse to the particular type of cancer.

The features of the method, the system and developments and embodiments thereof stated previously may be combined with one another and/or stand-alone. The exemplary embodiment illustrated in the figures illustrates by way of example a possible, but not conclusive, combination of features.

DETAILED DESCRIPTION

Figure 1:
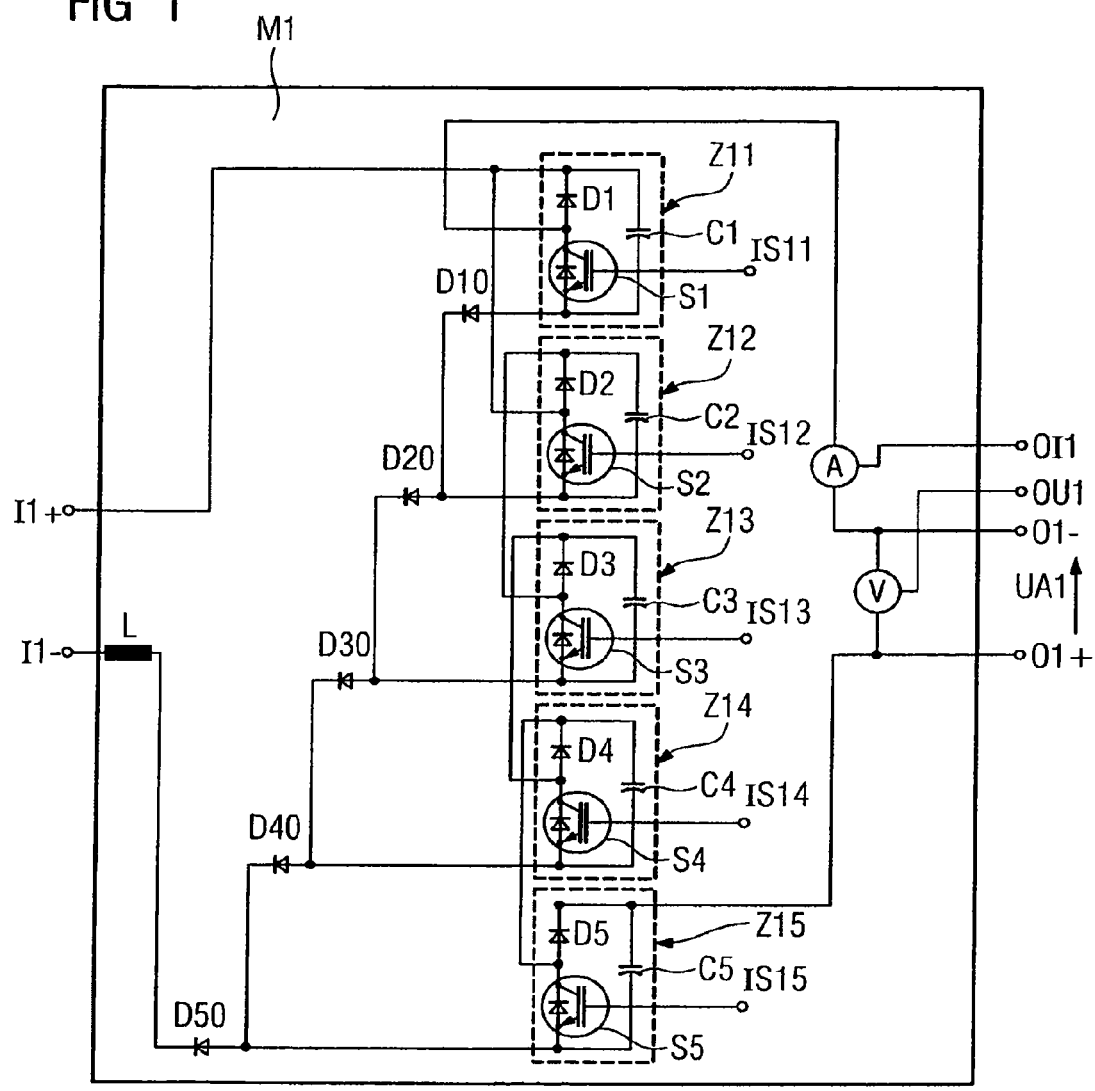
FIG. 1 shows one embodiment of a block diagram of a module including multiple cells in a Marx circuit.

In one embodiment, as shown in FIG. 1, a module M1 may include multiple cells Z11, Z12, Z13, Z14 and Z15 of a Marx generator. Each cell Z11, Z12, Z13, Z14 and Z15 of the Marx generator has a stage capacitor C1, C2, C3, C4 and C5. The module M1 has a first input I1+ and a second input I1− for applying a charge voltage. When the charge voltage is applied, a charge current flows which charges the stage capacitors C1, C2, C3, C4 and C5. The diodes D1, D2, D3, D4, D5, D10, D20, D30, D40 and D50 connect the stage capacitors C1, C2, C3, C4 and C5 to one another in parallel for the charging. The charge current for the stage capacitor C1 of the cell Z11 flows through the stage capacitor C1, the diodes D10, D20, D30, D40 and D50 and through the charging inductor L to the negative power input I1−. The charge current for the stage capacitor C2 of the cell Z12 flows through the diode D2, the stage capacitor C2, the diodes D20, D30, D40 and D50 and through the charging inductor L to the negative power input I1−. The corresponding charge flow for the stage capacitors C3, C4 and C5 is illustrated in the same way from FIG. 1.

Each cell Z11, Z12, Z13, Z14 and Z15 has one semiconductor switch S1, S2, S3, S4 and S5, respectively. The semiconductor switches S1, S2, S3, S4 and S5 are connected to the stage capacitors C1, C2, C3, C4 and C5 and outputs O1−, O1+ of the module M1 such that, when the semiconductor switches S1, S2, S3, S4 and S5 are switched jointly to the conducting state, the stage capacitors C1, C2, C3, C4 and C5 of the module M1 are connected in series. The series connection of the stage capacitors C1, C2, C3, C4 and C5 may be connected to the outputs O1−, O1+ of the module M1.

The charging process may be complete when all the stage capacitors C1 to C5 of the cells Z11 to Z15 have the desired charge. When the charging process is complete, the semiconductor switches S1, S2, S3, S4 and S5 may jointly be switched at a desired time to the conducting state so that a voltage pulse of, for example, 5 µs is emitted as an output voltage UA1 at the outputs O1−, O1+. The peak voltage value may correspond to the sum of the individual capacitor voltages in the charged state.

An individual stage capacitor C1, C2, C3, C4 or C5 of the module M1 or some of the stage capacitors C1, C2, C3, C4 and/or C5 of the module M1 may be connected to the outputs O1−, O1+. For example, to connect the stage capacitor C1 of the first cell Z11, the semiconductor switch S1 is switched to the conducting state while the other semiconductor switches S2, S3, S4 and S5 remain in the blocking state. Stage capacitor C1 is connected by the switching of the first semiconductor switch S1 via the diodes D2, D3, D4 and D5 to the positive output O1+ and via the semiconductor switch S1 to the negative output O1−.

The semiconductor switches S1, S2, S3, S4 and S5 include, respectively, a control input Is11, Is12, Is13, Is14 and Is15. Depending on the signal applied to this control input Is11, Is12, Is13, Is14 and Is15, the respective semiconductor switch S1, S2, S3, S4 and S5 is switched to the conducting or to the blocking state. For triggering, these control inputs Is11, Is12, Is13, Is14 and Is15 can be connected to a driver with fiber-optic isolation. One or more drivers may be integrated in the module M1.

In one embodiment, as shown in FIG. 1, the semiconductor switches S1, S2, S3, S4, S5 are IGBTs. Alternatively, other semiconductor switches, such as thyristors, GTOs or DMOS field-effect transistors, can be used as semiconductor switches. The module M1 may include a current-measurement device A and a voltage measurement device V, which may be connected to the outputs O1−, O1+. The number (five) of cells Z11 to Z15 shown in FIG. 1 is only an example. According to the principle shown in FIG. 1, two or more cells may be connected.

Figure 2:
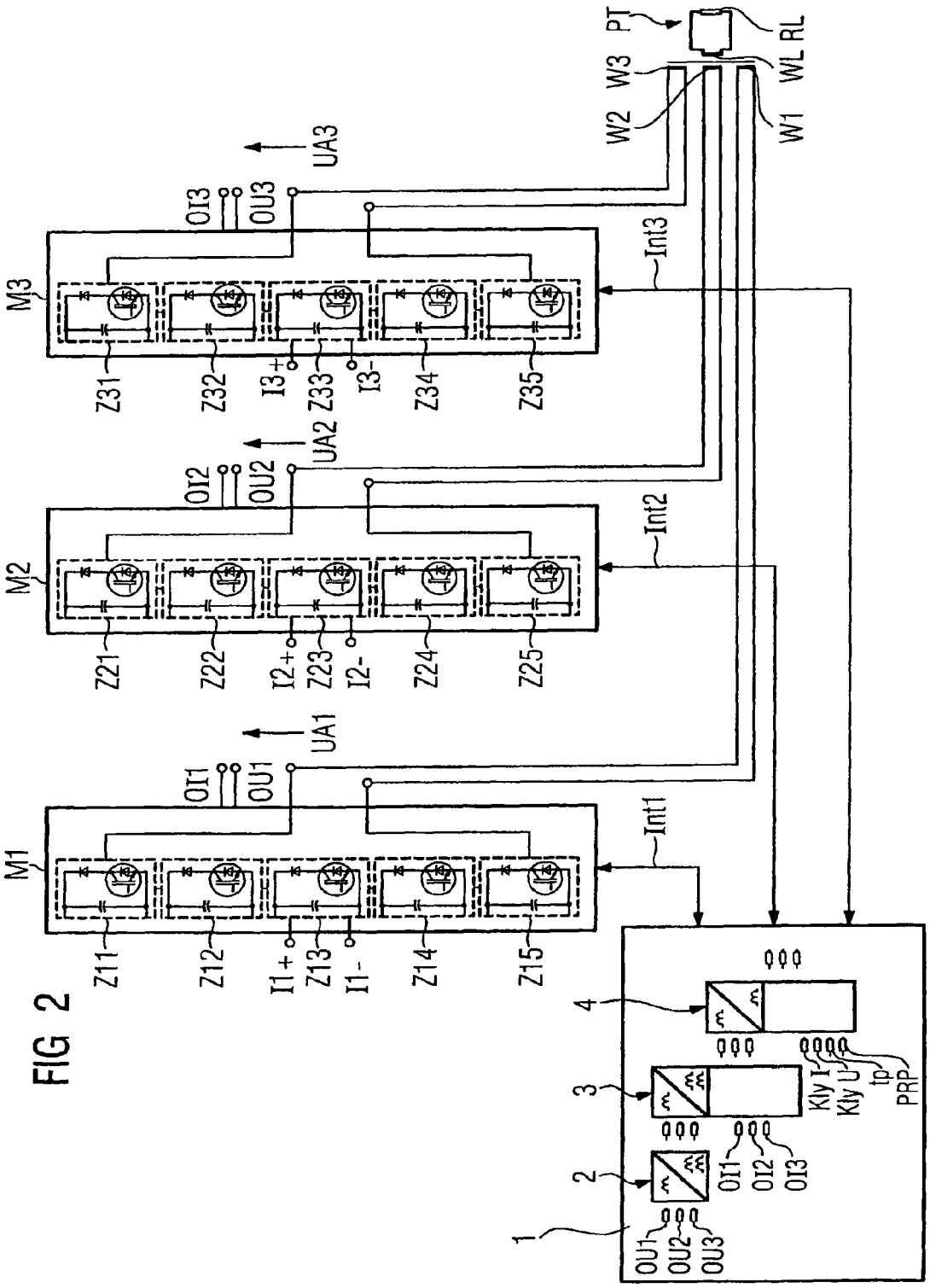
FIG. 2 shows one embodiment of a block diagram of a system including three modules, a control circuit, and a pulse transformer.

In one embodiment, as shown in FIG. 2, three modules M1, M2 and M3 include five cells Z11, Z12, Z13, Z14, Z15, Z21, Z22, Z23, Z24, Z25, Z31, Z32, Z33, Z34, Z35, respectively, of a Marx generator. The module M1, shown in FIG. 2, corresponds to the module M1 shown in greater detail in FIG. 1. The structure of modules M2 and M3 corresponds to the structure of module M1. The inputs I1+, I1−, I2+, I2−, I3+, I3− of the modules M1, M2 and M3 can be connected to a supply voltage for charging the stage capacitors. The output voltages UA1, UA2 and UA3 of the modules M1, M2, M3 act upon windings W1, W2 and W3 of a pulse transformer. Each module M1, M2, M3 includes a current-measuring output OI1, OI2 and OI3 and a voltage-measuring output OU1, OU2, OU3. Measuring outputs and control inputs of the modules M1, M2, M3 are connected, respectively, via an interface Int1, Int2 and Int3 to a control circuit 1. The interfaces Int1, Int2, Int3 may be bidirectional interfaces. The number (three) of modules M1 to M3 in FIG. 2 is only an example. One or more modules may be used.

Figure 3:
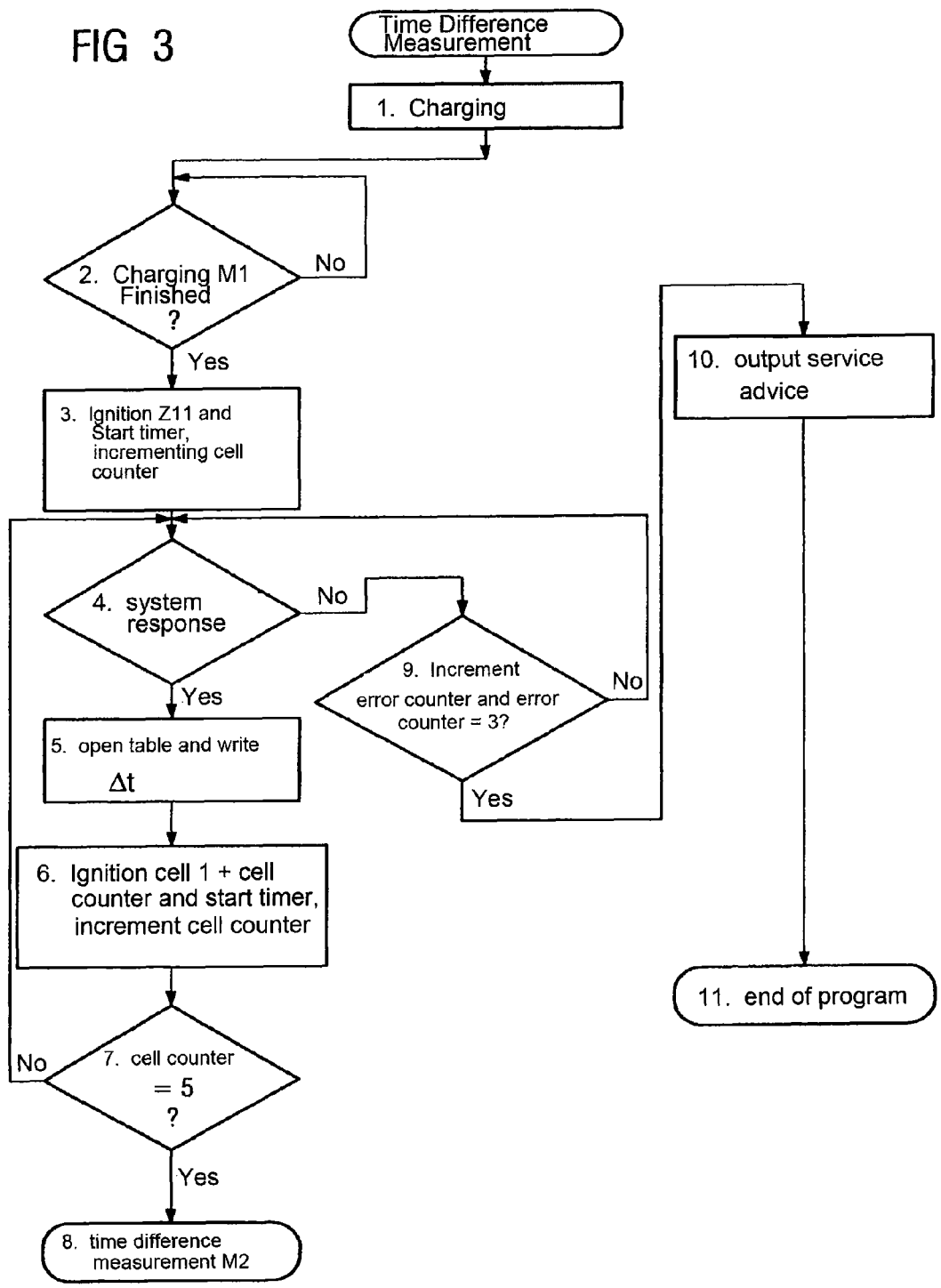
FIG. 3 shows a flow diagram of one embodiment of a method for generating a pulse voltage.

FIG. 3 shows a method that may be implemented using an electric circuit in a Marx configuration, as shown, for example, in FIG. 1 or 2. The temporal distance between the transition of two semiconductor switches from the blocking to the conducting state and/or from the conducting to the blocking state may be decreased. The semiconductor switches S1 to S5 are individually controlled by a switch-on signal and a switch-off signal, respectively. The semiconductor switches S1 to S5 may receive the switch-on signal and the switch-off signal at different times.

A switch-on time difference may be measured for each cell Z11 to Z15 (Z21 to Z25, Z31 to Z35), respectively. The switch-on time difference is measured between a switch-on signal for switching the respective semiconductor switch of the cell Z11 to Z15 (Z21 to Z25, Z31 to Z35) to the conducting state and a system response dependent on the switching to the conducting state. The semiconductor switches of the cells Z11 to Z15 (Z21 to Z25, Z31 to Z35) may be controlled for the voltage pulse as a function of each switch-on time difference by the measurement of the individual switch-on time differences. The switch-on signal to the respective cell Z11 to Z15 (Z21 to Z25, Z31 to Z35) is generated in such a time-shifted manner that a system response of each cell Z11 to Z15 (Z21 to Z25, Z31 to Z35) is simultaneous. The system response being dependent on the switching to the conducting state. This applies analogously to switch-off time differences from the conducting to the blocking state with the associated system response.

FIG. 3 represents a part of such a method schematically as a flow diagram. In act 1, the stage capacitors C1 to C5 of the module M1 are charged. In act 2, a check is carried out as to whether the charging is complete. If the stage capacitors C1 to C5 are not yet adequately charged, the check from act 2 is carried out again. Otherwise, in act 3 the first cell Z11 is ignited, a time meter (timer) started and a cell counter incremented. The semiconductor switches S2 to S5 of the remaining cells Z12 to Z15 are in the blocking state. For ignition, a switch-on signal with a rising edge is applied to the semiconductor switch S1 of the cell Z11. The time of the rising edge starts the high-resolution timer (time meter). This timer has a resolution of less than or equal to 5 ns.

In act 4, a check is carried out as to whether a system response has been received. The system response has a current (I) and/or voltage course (U) in relation to time (t). The current (I) and/or voltage course (U) may be measured at the outputs O1+, O1− of the module M1. If a system response is detected in act 4, the time that lapses between the edge and the arrival of the system response is measured. The system response stops the timer for this purpose.

In act 5, a table is opened in a memory of the control circuit 1 and the value of the switch-on time difference and/or the switch-off time difference Δtn for the cell 11 is written. In act 6, the next cell (12) is ignited, the time meter (timer) started and the cell counter incremented.

In act 7, a check is carried out as to whether all the cells Z11 to Z15 of the module M1 have been measured. If not all of the cells of module M1 been measured, act 4 is carried out again for the cells not measured. When all the runtimes of the cells Z11 to Z15 have been measured, after act 7, the measurement is carried out in act 8 for the cells Z21 to Z25 of module M2. If a faulty behavior of the system is detected in at 9, a service advice is output in act 10. In act 11, the measuring program is closed and the system operates in a secure mode or shut down completely.

Figure 4:
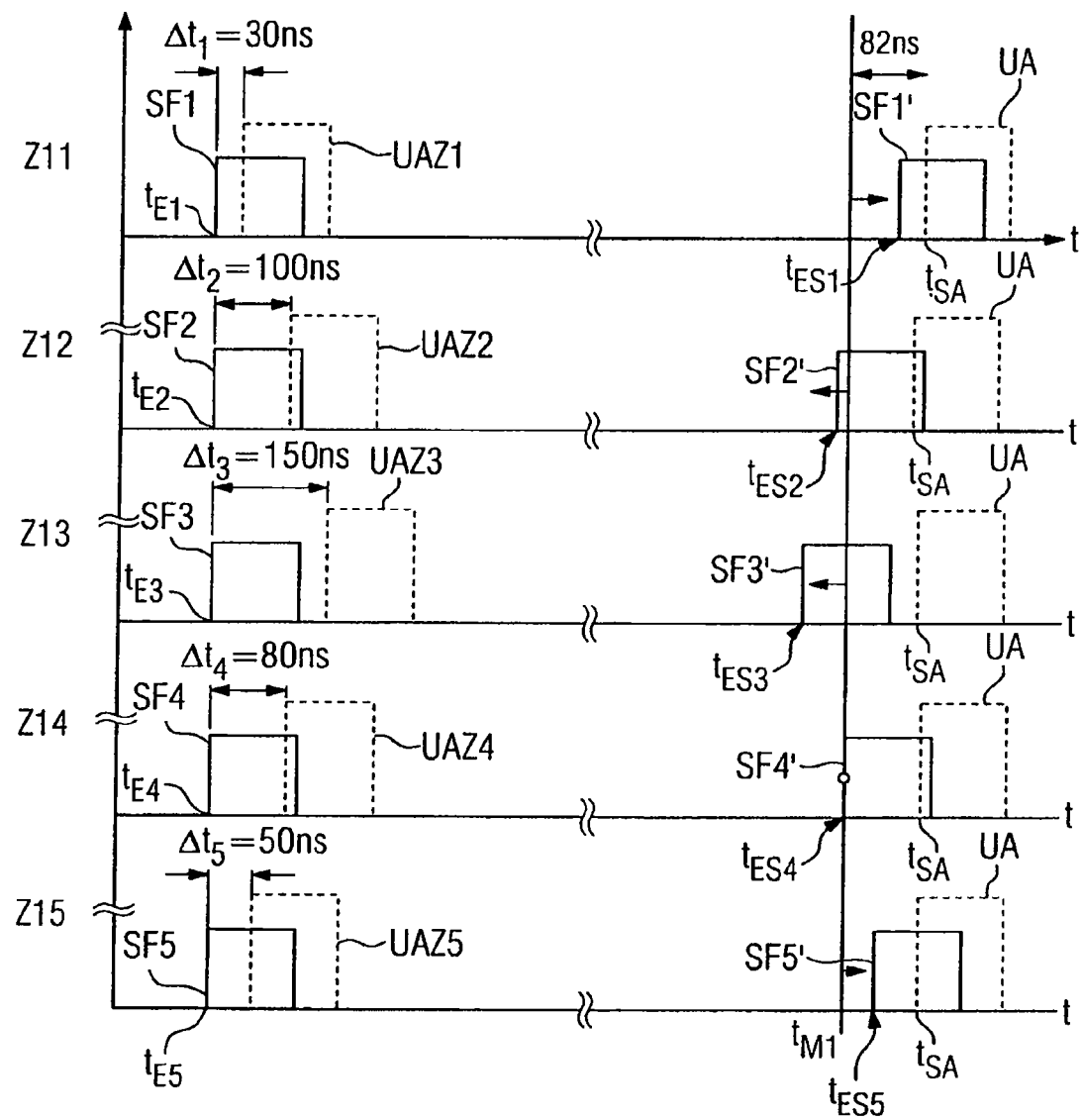
FIG. 4 shows diagrams including switching signals and system responses.

FIG. 4 shows diagrams relating to the measurement acts in FIG. 3 and to the corresponding control. The left-hand section of FIG. 4 displays the measurement results for the individual cells Z11 to Z15.

At time tE1 the positive edge of the switch-on signal SF1 (the solid line in the diagram in FIG. 4) for the cell Z11 prompts its ignition. The semiconductor switches S2 to S5 (of the other cells Z12 to Z15) remain in the blocking state. The system response (dashed line) corresponds to a rise in the output voltage UAZ1. In the first cell Z11, the time difference Δt1 between the positive edge SF1 of the switch-on signal and the positive edge of the output voltage UAZ1 is 30 ns. In the exemplary embodiment shown in FIG. 4, the system response UAZ1 is determined from the output voltage course. Alternatively, the power course or the current course may be used to determine the system response.

The time difference Δt2 for the second cell Z12 may be determined. The time difference Δt2 may be the time between the edge SF2 at time tE2 and the output voltage UAZ2 for the second cell Z12. In the exemplary embodiment shown in FIG. 4, the time difference Δt2 is 100 ns.

The time difference Δt3 for the third cell Z13 may be determined. The time difference Δt3 may be the time between the edge SF3 at time tE3 and the output voltage UAZ3 for the third cell Z13. In the exemplary embodiment shown in FIG. 4, the time difference Δt3 is 150 ns.

The time difference Δt4 for the fourth cell Z14 may be determined. The time difference Δt4 may be the time between the edge SF4 at time tE4 and the output voltage UAZ4 for the fourth cell Z14. In the exemplary embodiment shown in FIG. 4, the time difference Δt4 is 80 ns.

The time difference Δt5 for the fifth cell Z15 may be determined. The time difference Δt5 may be the time between the edge SF5 at time tE5 and the output voltage UAZ5 for the fifth cell Z15. In the exemplary embodiment shown in FIG. 4, the time difference Δt5 is 50 ns.

The right-hand section of FIG. 4 displays the control corresponding to the measurement results. A reference time tM1 is calculated from the time differences Δt1 to Δt5. The reference time tM1 may be a mean value calculated from the time differences Δt1 to Δt5. In the example shown in FIG. 4, this is an average runtime of 82 ns. In an alternative embodiment, the mean between the shortest and the longest runtime could be used as a reference time. For example, the time duration between reference time and system response would be 90 ns (not shown). The determined reference time tM1 may be the optimum time as it lies between the shortest and the longest runtime. At the reference time tM1, the generation of the respective edge SF1' to SF5' of the switch-on signal for the respective cell Z11 to Z15 is time-shifted forward or backward to the times tES1, tES2, tES3, tES4 and tES5 (as times of generation of the edge of the switch-on signal).

The respective runtime measured between the respective edge of the switch-on signal SF1 to SF5 and the respective system response UAZ1 to UAZ5 may be evaluated, such that the system response UA of each cell Z11 to Z15 occurs simultaneously and causes an output voltage UA to rise for each cell simultaneously. The output voltages UA are added in accordance with the series connection of the stage capacitors C1 to C5 and generate the desired voltage pulse (not shown).

FIG. 4 shows the switch-on time differences between switch-on signal and system response. The switch-off time differences between a switch-off signal and the system response may differ from the switch-on time differences. It is possible to proceed analogously for the switch-off time differences. The switch-off signals (falling edge) for the cells Z11 to Z15 are time-shifted and filed in a table, such that the cells as a result switch off simultaneously. The semiconductor switches S1 to S5 block simultaneously.

All other program parts use this table of switch-on time differences and switch-off time differences in a subroutine for a simultaneous system response of all the cells Z11 to Z15.

This applies analogously to the identically structured modules M2 and M3 comprising the cells Z21 to Z25 and Z31 to Z35, as shown in FIG. 2.

In one embodiment, asymmetrical voltage distribution to the series-connected semiconductor switches S1 to S5 may be reduced or even avoided completely. For example, the semiconductor switches, such as IGBTs, have different parameters that relate to the runtime. The simultaneous system response of all the cells Z11 to Z15 may prevent the voltage pulse forming in steps as a result of non-simultaneous switching. This exemplary embodiment may consequently increase the magnitude of the gradient of the edge of the system response.

In one embodiment, as shown in FIG. 2, the outputs of modules M1, M2 and M3 are connected to windings W1, W2 and W3 respectively of a pulse transformer PT. The pulse transformer PT includes a secondary winding WL, which is connected to a load RL, for emitting the voltage pulse. To prevent an asymmetrical current distribution within the individual modules M1, M2, M3, which respectively drive a primary winding W1, W2, W3 of the pulse transformer PT, the runtime differences between the individual modules M1, M2, M3 are measured according to a principle similar to the method explained above.

At time tM1 of the rising edge for the module M1, which has been charged previously, a high-resolution timer is started. The timer may include a resolution less than or equal to 5 ns. The module time difference, which elapses until the system response dependent on the current is received in the control circuit 1, is determined. The module time difference is filed in a table in a memory. The module time difference is dependent on characteristics of the components of the module and on the impedance of the pulse transformer PT, the impedance of the feed line and optionally on the impedance of the load RL. All the factors influencing the system response may be taken into account together by measuring the runtime.

Module time differences may be determined for the modules M2 and M3 and stored. Once the module time differences of all the modules M1, M2 and M3 have been recorded, a joint switching time is calculated for all the modules M1, M2 and M3. The joint switching time may lie at the mean point between the shortest and the longest runtime. For each module M1, M2, M3, a switch-on signal and a switch-off signal are now time-shifted in relation to the joint switching time, such that the current-dependent system response of all the modules M1, M2, M3 occurs simultaneously or almost simultaneously. The distribution of current within the individual modules M1, M2, M3 may be symmetrized, such that the current flow of the individual modules M1, M2, M3 through the pulse transformer PT occurs simultaneously.

The control circuit 1 may have multiple functions, which can be implemented by hardware and a programmable module such as, for example, a microcontroller. As shown in FIG. 2, in the first function block 2, the voltage-dependent (OU1, OU2 OU3) system responses of the cells Z11 to Z15, Z21-Z35, or Z31-Z35 of the respective module M1, M2, M3 are synchronized using the time differences by time-shifting the switch-on signal/switch-off signal of the respective cell Z11 to Z15, Z21-Z35, or Z31-Z35 by the runtime regulation. In the second function block 3, the modules are synchronized in relation to each other by determining the current-dependent (OI1, OI2, OI3) system responses of the respective module M1, M2, M3 and then by synchronizing by time-shifting the switching points of the modules M1, M2, M3 relative to each other.

The third function block 4 includes the higher-level control, such as, for example, the load regulation for generating an electron beam of a klystron, incorporating the additional parameters Kly I, Kly U, tp and PRP. For medical applications, a voltage pulse may have a shape approximating a rectangle. A stable electron beam may be generated during the duration of the plateau of the rectangular signal. An adjustability of the shape of the voltage pulse is effected by the parameters Kly I, Kly U, tp and PRP for the targeted generation of a high-frequency wave for the treatment of cancer. The wave characteristics dependent on the parameters Kly I, Kly U, tp and PRP may be adapted to the particular type of cancer. The power of an electron beam or of a photon beam may be adjusted via the parameters Kly I and Kly U. A pulse width may be adjusted by the parameter tp. The pulse repetition frequency on the other hand can be adjusted by the parameter PRP.

The advantages are inherent in the modular concept in a Marx configuration with n series-connected and m parallel-connected semiconductor switches (IGBTs etc.), including a cascaded active regulation of the voltage and current distribution. In this way the system can also be used with multi-core pulse transformers in particular for magnetron loading or for a klystron loading. In addition a stabilization of the operating parameters is preferably integrated in the control such that, for example, a temperature drift or an ageing symptom, for example of the semiconductor switches, can be determined as operating parameters by means of cyclic sequential measurement intervals during what is termed a pre-scan sequence or a warm-up sequence.

An elaborate and therefore cost-intensive selection, a pairing and matching operations can be avoided by the system shown in FIG. 2. Constant monitoring of the cells Z11 to Z35 may be carried out in synergy by the system shown in FIG. 2. For example, short-circuits may be detected. Slowly approaching failures may be detected, for example, in that the system response maps a deterioration of electrical parameters of a stage capacitor or of a semiconductor switch. The deterioration of electrical parameters may be determined through measurement of the current/voltage course and/or the time difference, for example, by comparison to threshold values. Diagnostic information may be output. The diagnostic information enables replacement of the component that has deteriorated before a total failure.

Redundant operation may be ensured. If one or more cells fail, the other modules may be adapted in accordance with the number of failed cells, such that an appropriate system response is generated again at the output of all the modules. Operation with reduced power may be possible.

The present embodiments are not restricted to the exemplary embodiment shown in FIGS. 1 to 4. The basic idea underlying the present embodiments can be applied to all Marx generators with multiple semiconductor switches, such as a programmable control circuit. A single or an arbitrary plurality of modules including two or more cells can be provided. It is also in principle possible to select another reference time which does not lie at the mean point of the runtimes.

The invention claimed is:

1. A method for controlling a pulse generator comprising a plurality of cells, each cell including a controllable semiconductor switch and a capacitor for generating a voltage pulse through series connection and/or parallel connection of the capacitors by the semiconductor switches, the method comprising:

performing in a control circuit:
generating a first switch-on signal for switching the respective semiconductor switch of a cell to a conducting state, measuring a system response for each cell of the plurality of cells, wherein the system response is dependent on a switching of a respective semiconductor switch of the cell to the conducting state, measuring a switch-on time difference for each cell of the plurality of cells, wherein for each cell the switch-on time difference being measured between a first switch-on signal for switching the respective semiconductor switch of the cell to the conducting state and the measured system response dependent on the switching of the respective semiconductor switch to the conducting state, controlling the semiconductor switches of each cell for the voltage pulse as a function of the switch-on time difference, and generating a second switch-on signal for each cell as a function of the measured switch-on time, wherein the second switch-on signal is generated in such a time-shifted manner that the system response of all cells of the plurality occurs simultaneously, the system response being dependent on the switching to the conducting state.

2. The method as claimed in claim 1, comprising:

measuring a switch-off time difference for each cell, the switch-off time difference being measured between a first switch-off signal for switching the semiconductor switch to a blocking state and a system response dependent on the switching to the blocking state, controlling the semiconductor switches of the cells for the voltage pulse as a function of the switch-off time differences, a second switch-off signal is generated in such a time-shifted manner that the system response of all cells of the plurality occurs simultaneously, the system response being dependent on the switching to the blocking state.

3. The method as claimed in claim 2, wherein one or more modules include multiple series-connected cells, the modules being triggered to generate the voltage pulse, the method comprising:

measuring a module-switch-on time difference for each module, the module-switch-on time difference being measured between a switch-on time for a generation of a current pulse by the respective module and a system response dependent on the current pulse, controlling the modules for the voltage pulse as a function of the module-switch-on time differences, the switch-on time of the respective module being generated in such a time-shifted manner that the system response of each module occurs simultaneously, the system response of each module being dependent on the current pulse.

4. The method as claimed in claim 3, wherein the switch-on time differences, the switch-off time differences, the module-switch-on time differences, the switch-on times, or any combination thereof are stored in a table in a non-volatile memory.

5. The method as claimed in claim 1, wherein measuring includes measuring cyclically or measuring in a stipulated order.

6. The method as claimed in claim 5, wherein measuring includes measuring during a warm-up sequence.

7. The method as claimed in claim 1, comprising: determining a change of electrical characteristics of a component from measuring the system response.

8. The method as claimed in claim 7, wherein, depending on the change, a piece of diagnostic information is output.

9. A system for generating a voltage pulse with a Marx generator, the system comprising:

multiple cells connected in series and/or in parallel, wherein each cell includes a capacitor and a semiconductor switch, and a control circuit connected to each cell for controlling the semiconductor switch, the control circuit operable to:
generate a first switch-on signal for switching each individual semiconductor switch to a conducting state, measure a system response for a respective individual cell, wherein the system response is dependent on the switching of the respective semiconductor switch to the conducting state, measure a time difference between generation of the first switch-on signal and the system response for each cell, generate a second switch-on signal for each individual semiconductor switch to the conducting state as a function of the respective time difference in such a time shifted manner that the system response of all cells is simultaneous, and control the semiconductor switches of the cells for a series connection and/or parallel connection of the capacitors to generate the voltage pulse.

10. The system as claimed in claim 9, comprising a plurality of modules including respectively multiple series-connected cells, wherein outputs of the modules are coupled for generating the voltage pulse.

11. The system as claimed in claim 10, wherein the control circuit individually controls each module and is connected via an interface to each module.

12. The system as claimed in claim 9, comprising a magnetron or a klystron.

* * * * *